(12) United States Patent
Chen et al.

(10) Patent No.: US 6,704,020 B1
(45) Date of Patent: Mar. 9, 2004

(54) ARCHITECTURE FOR VIDEO COMPRESSOR TO EFFICIENTLY ADDRESS SYNCHRONOUS MEMORY

(75) Inventors: Wen-Kuan Chen, Hsinchu Hsien (TW); Jen-Yi Liao, Taichung (TW)

(73) Assignee: Sunplus Technology Co., Ltd., Hsin-Chu (TW)

( * ) Notice: Subject to any disclaimer, the term of this patent is extended or adjusted under 35 U.S.C. 154(b) by 386 days.

(21) Appl. No.: 09/704,621

(22) Filed: Nov. 3, 2000

(51) Int. Cl.⁷ .................................................. G09G 3/18
(52) U.S. Cl. .................... 345/540; 345/781; 345/803; 345/804; 345/806; 348/716
(58) Field of Search ............................. 345/804, 806, 345/781, 540

(56) References Cited

U.S. PATENT DOCUMENTS

| | | | | |
|---|---|---|---|---|
| 5,170,468 A | * | 12/1992 | Shah et al. ................. | 395/166 |
| 6,088,047 A | * | 7/2000 | Bose et al. ................. | 345/517 |
| 6,411,334 B1 | * | 6/2002 | Yeh et al. ................... | 348/445 |
| 6,493,005 B1 | * | 12/2002 | Wu ............................. | 345/804 |

* cited by examiner

Primary Examiner—Matthew C. Bella
Assistant Examiner—Allen E Quillen
(74) Attorney, Agent, or Firm—Bacon & Thomas, PLLC

(57) ABSTRACT

An architecture for video decompressor to efficiently access synchronously memory includes a synchronous memory device having an A-bank and B-bank for being stored with image data, and a memory controller for controlling data access to the synchronous memory to perform motion compensation and display. The image data has a plurality of scan lines and every four scan lines are grouped for being periodically arranged in the synchronous memory in such a manner that the A-bank is sequentially stored with (4N+0)-th and (4N+1)-th scan lines, and the B-bank is sequentially stored with the (4N+2)-th and (4N+3)-th scan lines, where N is a non-negative integer, so as to always perform memory operations by alternately accessing the A-bank and B-bank.

16 Claims, 27 Drawing Sheets

| A-BANK | B-BANK |
|---|---|
| 0 | 2 |
| 1 | 3 |
| 6 | 4 |
| 7 | 5 |
| 8 | 10 |
| 9 | 11 |
| 14 | 12 |
| 15 | 13 |
| 16 | 18 |
| 17 | 19 |
| . | . |
| . | . |

| A-BANK | B-BANK |
|--------|--------|
| 0      | 2      |
| 1      | 3      |
| 4      | 6      |
| 5      | 7      |
| 8      | 10     |
| 9      | 11     |
| 12     | 14     |
| 13     | 15     |
| 16     | 18     |
| 17     | 19     |

Fig. 5

Frame Prediction
  Mv Offset=4N

|          | 0 | 1 | 2 | 3 | 4 | 5 | 6 | 7 | 8 | 9 | 10 | 11 | 12 | 13 | 14 | 15 | 16 |
|----------|---|---|---|---|---|---|---|---|---|---|----|----|----|----|----|----|----|
| Original | A | A | B | B | A | A | B | B | A | A | B  | B  | A  | A  | B  | B  | A  |
|          | 0 | 2 | 1 | 3 | 4 | 6 | 5 | 7 | 8 | 10| 9  | 11 | 12 | 14 | 13 | 15 | 16 |
| Reordered| A | B | A | B | A | B | A | B | A | B | A  | B  | A  | B  | A  | B  | A  |

Mv Offset=4N+1

|         | 1 | 2 | 3 | 4 | 5 | 6 | 7 | 8 | 9 | 10 | 11 | 12 | 13 | 14 | 15 | 16 | 17 |
|---------|---|---|---|---|---|---|---|---|---|----|----|----|----|----|----|----|----|
| Original| A | B | B | A | A | B | B | A | A | B  | B  | A  | A  | B  | B  | A  | A  |
|         | 1 | 2 | 4 | 3 | 5 | 6 | 8 | 7 | 0 | 10 | 12 | 11 | 13 | 14 | 16 | 15 | 17 |
| Reorder | A | B | A | B | A | B | A | B | A | B  | A  | B  | A  | B  | A  | B  | A  |

Mv Offset=4N+2

|          | 2 | 3 | 4 | 5 | 6 | 7 | 8 | 9 | 10 | 11 | 12 | 13 | 14 | 15 | 16 | 17 | 18 |
|----------|---|---|---|---|---|---|---|---|----|----|----|----|----|----|----|----|----|
| Original | B | B | A | A | B | B | A | A | B  | B  | A  | A  | B  | B  | A  | A  | B  |
|          | 4 | 2 | 5 | 3 | 8 | 6 | 9 | 7 | 12 | 10 | 13 | 11 | 16 | 14 | 17 | 15 | 18 |
| Reordered| A | B | A | B | A | B | A | B | A  | B  | A  | B  | A  | B  | A  | B  | A  |

Mv Offset=4N+3

|          | 3 | 4 | 5 | 6 | 7 | 8 | 9 | 10 | 11 | 12 | 13 | 14 | 15 | 16 | 17 | 18 | 19 |
|----------|---|---|---|---|---|---|---|----|----|----|----|----|----|----|----|----|----|
| Original | B | A | A | B | B | A | A | B  | B  | A  | A  | B  | B  | A  | A  | B  | B  |
|          | 4 | 3 | 5 | 6 | 8 | 7 | 9 | 10 | 12 | 11 | 13 | 14 | 16 | 15 | 17 | 18 | 19 |
| Reordered| A | B | A | B | A | B | A | B  | A  | B  | A  | B  | A  | B  | A  | B  | A  |

Fig. 6

Mv Offset=0
Original    0   2   4   6   8   10  12  14  16  18  20  22  24  26  28  30  32
            A   B   A   B   A   B   A   B   A   B   A   B   A   B   | A   B   A |

Mv Offset=1
Original    2   4   6   8   10  12  14  16  18  20  22  24  26  28  30  32  34
            B   A   B   A   B   A   B   A   B   A   B   A   B   A   B   A   B
Reordered   4   2   8   6   12  10  16  14  20  18  24  22  28  26  32  30  34
            A   B   A   B   A   B   A   B   A   B   A   B   | A   B   B |

Fig. 7

Mv Offset=0
Original    1   3   5   7   9   11  13  15  17  19  21  23  25  27  29  31  33
            A   B   A   B   A   B   A   B   A   B   A   B   A   B   | A   B   A |

Mv Offset=1
Original    3   5   7   9   11  13  15  17  19  21  23  25  27  29  31  33  35
            B   A   B   A   B   A   B   A   B   A   B   A   B   A   B   A   B
Reordered   5   3   9   7   13  11  17  15  21  19  25  23  29  27  33  31  35
            A   B   A   B   A   B   A   B   A   B   A   B   | A   B   B |

Fig. 8

ABA
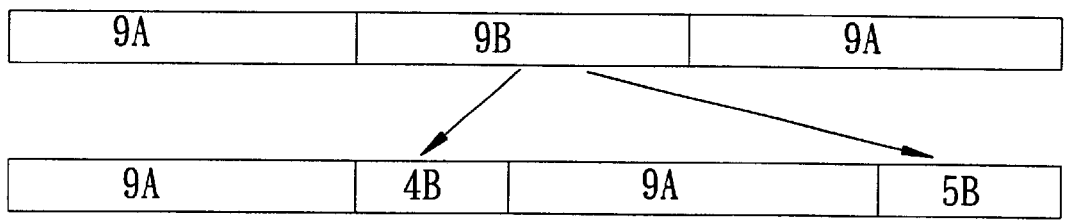
ABB
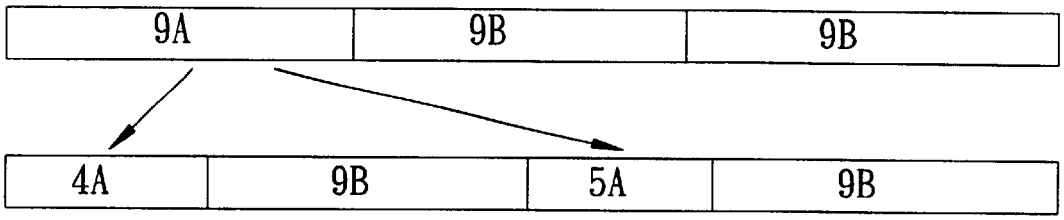
Fig. 9

LUMA PIXEL LAYOUT

| A-BANK | | | B-BANK | | |
|---|---|---|---|---|---|
| 0 | 0 | 0 | 2 | 0 | 1 |
| 1 | 1 | 0 | 3 | 1 | 1 |
| 4 | 2 | 2 | 6 | 2 | 3 |
| 5 | 3 | 2 | 7 | 3 | 3 |
| 8 | 4 | 4 | 10 | 4 | 5 |
| 9 | 5 | 4 | 11 | 5 | 5 |
| 12 | 6 | 6 | 14 | 6 | 7 |
| 13 | 7 | 6 | 15 | 7 | 7 |
| 16 | 8 | 8 | 18 | 8 | 9 |
| 17 | 9 | 8 | 19 | 9 | 9 |

CHROMA LINE REPEAT ASSOCIATED LINE SEQUENCE

CHROMA FIELD REPEAT ASSOCIATED LINE SEQUENCE

CHROMA PIXEL LAYOUT

| A-BANK | B-BANK |
|---|---|
| 1 | 0 |
| 2 | 3 |
| 5 | 4 |
| 6 | 7 |
| 8 | 9 |
| 10 | 11 |
| 12 | 14 |
| 13 | 15 |
| 16 | 18 |
| 17 | 19 |

Fig. 21

| A-BANK | B-BANK |
|--------|--------|
| 0 | 2 |
| 1 | 3 |
| 6 | 4 |
| 7 | 5 |
| 8 | 10 |
| 9 | 11 |
| 14 | 12 |
| 15 | 13 |
| 16 | 18 |
| 17 | 19 |
| . | . |
| . | . |

Fig. 22

| A-BANK | B-BANK |
|--------|--------|
| 1 | 0 |
| 2 | 3 |
| 5 | 4 |
| 6 | 7 |
| 9 | 8 |
| 10 | 11 |
| 13 | 12 |
| 14 | 15 |
| 17 | 16 |
| 18 | 19 |
| . | . |
| . | . |

Fig. 23

| A-BANK | B-BANK |
|--------|--------|
| LUMA FOR DISPLAY | CHROMA FOR DISPLAY |

Fig. 24

| A-BANK | B-BANK |
|--------|--------|
| CHROMA FOR DISPLAY | LUMA FOR DISPLAY |

Fig. 25

| A-BANK | B-BANK |
|---|---|
| 0 | 1 |
| 2 | 3 |
| 5 | 4 |
| 7 | 6 |
| 8 | 9 |
| 10 | 11 |
| 14 | 15 |
| 12 | 13 |
| 16 | 17 |
| 18 | 19 |
| . | . |
| . | . |

Fig. 26

```
Mv Offset=8N
           0  1  2  3  4  5  6  7  8  9  10 11 12 13 14 15 16
Original   A  A  B  B  B  B  A  A  A  A  B  B  B  B  A  A  A
Reordered  0  2  1  3  6  4  7  5  8  10 9  11 14 12 15 13 16
           A  B  A  B  A  B  A  B  A  B  A  B  A  B [A  B  A]

Mv Offset=8N+1
           1  2  3  4  5  6  7  8  9  10 11 12 13 14 15 16 17
Original   A  B  B  B  B  A  A  A  A  B  B  B  B  A  A  A  A
Reordered  1  2  6  3  7  4  8  5  9  10 14 11 15 12 16 13 17
           A  B  A  B  A  B  A  B  A  B  A  B  A  B [A  B  A]

Mv Offset=8N+2
           2  3  4  5  6  7  8  9  10 11 12 13 14 15 16 17 18
Original   B  B  B  B  A  A  A  A  B  B  B  B  A  A  A  A  B
Reordered  6  2  7  3  8  4  9  5  14 10 15 11 16 12 17 13 18
           A  B  A  B  A  B  A  B  A  B  A  B  A  B [A  B  B]

Mv Offset=8N+3
           3  4  5  6  7  8  9  10 11 12 13 14 15 16 17 18 19
Original   B  B  B  A  A  A  A  B  B  B  B  A  A  A  A  B  B
Reordered  6  3  7  4  8  5  9  10 14 11 15 12 16 13 17 18 19
           A  B  A  B  A  B  A  B  A  B  A  B  A  B [A  B  B]

Mv Offset=8N+4
           4  5  6  7  8  9  10 11 12 13 14 15 16 17 18 19 20
Original   B  B  A  A  A  A  B  B  B  B  A  A  A  A  B  B  B
Reordered  6  4  7  5  8  10 9  11 14 12 15 13 16 18 17 19 20
           A  B  A  B  A  B  A  B  A  B  A  B  A  B [A  B  B]

Mv Offset=8N+5
           5  6  7  8  9  10 11 12 13 14 15 16 17 18 19 20 21
Original   B  A  A  A  A  B  B  B  B  A  A  A  A  B  B  B  B
Reordered  6  5  7  10 8  11 9  12 14 13 15 18 16 19 17 20 21
           A  B  A  B  A  B  A  B  A  B  A  B  A  B [A  B  B]

Mv Offset=8N+6
           6  7  8  9  10 11 12 13 14 15 16 17 18 19 20 21 22
Original   A  A  A  A  B  B  B  B  A  A  A  A  B  B  B  B  A
Reordered  6  10 7  11 8  12 9  13 14 18 15 19 16 20 17 21 22
           A  B  A  B  A  B  A  B  A  B  A  B  A  B [A  B  A]

Mv Offset=8N+7
           7  8  9  10 11 12 13 14 15 16 17 18 19 20 21 22 23
Original   A  A  A  B  B  B  B  A  A  A  A  B  B  B  B  A  A
Reordered  7  10 8  11 9  12 14 13 15 18 16 19 17 20 22 21 23
           A  B  A  B  A  B  A  B  A  B  A  B  A  B [A  B  A]
```

Fig. 27

Mv Offset=4N

| | 0 | 2 | 4 | 6 | 8 | 10 | 12 | 14 | 16 | 18 | 20 | 22 | 24 | 26 | 28 | 30 | 32 |
|---|---|---|---|---|---|---|---|---|---|---|---|---|---|---|---|---|---|
| Original | A | B | B | A | A | B | B | A | A | B | B | A | A | B | B | A | A |
| Reordered | 0 | 2 | 6 | 4 | 8 | 10 | 14 | 12 | 16 | 18 | 22 | 20 | 24 | 26 | 30 | 28 | 32 |
| | A | B | A | B | A | B | A | B | A | B | A | B | A | B | [A | B | A] |

Mv Offset=4N+1

| | 2 | 4 | 6 | 8 | 10 | 12 | 14 | 16 | 18 | 20 | 22 | 24 | 26 | 28 | 30 | 32 | 34 |
|---|---|---|---|---|---|---|---|---|---|---|---|---|---|---|---|---|---|
| Original | B | B | A | A | B | B | A | A | B | B | A | A | B | B | A | A | B |
| Reordered | 6 | 2 | 8 | 4 | 14 | 10 | 16 | 12 | 22 | 18 | 24 | 20 | 30 | 26 | 32 | 28 | 34 |
| | A | B | A | B | A | B | A | B | A | B | A | B | A | B | [A | B | B] |

Mv Offset=4N+2

| | 4 | 6 | 8 | 10 | 12 | 14 | 16 | 18 | 20 | 22 | 24 | 26 | 28 | 30 | 32 | 34 | 36 |
|---|---|---|---|---|---|---|---|---|---|---|---|---|---|---|---|---|---|
| Original | B | A | A | B | B | A | A | B | B | A | A | B | B | A | A | B | B |
| Reordered | 6 | 4 | 8 | 10 | 14 | 12 | 16 | 18 | 22 | 20 | 24 | 26 | 30 | 28 | 32 | 34 | 36 |
| | A | B | A | B | A | B | A | B | A | B | A | B | A | B | [A | B | B] |

Mv Offset=4N+3

| | 6 | 8 | 10 | 12 | 14 | 16 | 18 | 20 | 22 | 24 | 26 | 28 | 30 | 32 | 34 | 36 | 38 |
|---|---|---|---|---|---|---|---|---|---|---|---|---|---|---|---|---|---|
| Original | A | A | B | B | A | A | B | B | A | A | B | B | A | A | B | B | A |
| Reordered | 6 | 10 | 8 | 12 | 14 | 18 | 16 | 20 | 22 | 26 | 24 | 28 | 30 | 34 | 32 | 36 | 38 |
| | A | B | A | B | A | B | A | B | A | B | A | B | A | B | [A | B | B] |

Fig. 28

Mv Offset=4N

| | 1 | 3 | 5 | 7 | 9 | 11 | 13 | 15 | 17 | 19 | 21 | 24 | 25 | 27 | 29 | 31 | 33 |
|---|---|---|---|---|---|---|---|---|---|---|---|---|---|---|---|---|---|
| Original | A | B | B | A | A | B | B | A | A | B | B | A | A | B | B | A | A |
| Reordered | 1 | 3 | 7 | 5 | 9 | 11 | 15 | 13 | 17 | 19 | 23 | 21 | 25 | 27 | 31 | 29 | 33 |
| | A | B | A | B | A | B | A | B | A | B | A | B | A | B | [A | B | A] |

Mv Offset=4N+1

| | 3 | 5 | 7 | 9 | 11 | 13 | 15 | 17 | 19 | 21 | 23 | 25 | 27 | 29 | 31 | 33 | 35 |
|---|---|---|---|---|---|---|---|---|---|---|---|---|---|---|---|---|---|
| Original | B | B | A | A | B | B | A | A | B | B | A | A | B | B | A | A | B |
| Reordered | 7 | 3 | 9 | 5 | 15 | 11 | 17 | 13 | 23 | 19 | 25 | 21 | 31 | 27 | 33 | 29 | 35 |
| | A | B | A | B | A | B | A | B | A | B | A | B | A | B | [A | B | B] |

Mv Offset=4N+2

| | 5 | 7 | 9 | 11 | 13 | 15 | 17 | 19 | 21 | 23 | 25 | 27 | 29 | 31 | 33 | 35 | 37 |
|---|---|---|---|---|---|---|---|---|---|---|---|---|---|---|---|---|---|
| Original | B | A | A | B | B | A | A | B | B | A | A | B | B | A | A | B | B |
| Reordered | 7 | 5 | 9 | 11 | 15 | 13 | 17 | 19 | 23 | 21 | 25 | 27 | 31 | 29 | 33 | 35 | 35 |
| | A | B | A | B | A | B | A | B | A | B | A | B | A | B | [A | B | B] |

Mv Offset=4N+3

| | 7 | 9 | 11 | 13 | 15 | 17 | 19 | 21 | 23 | 25 | 27 | 29 | 31 | 33 | 35 | 37 | 39 |
|---|---|---|---|---|---|---|---|---|---|---|---|---|---|---|---|---|---|
| Original | A | A | B | B | A | A | B | B | A | A | B | B | A | A | B | B | A |
| Reordered | 7 | 11 | 9 | 13 | 15 | 19 | 17 | 21 | 23 | 27 | 25 | 29 | 31 | 35 | 33 | 37 | 39 |
| | A | B | A | B | A | B | A | B | A | B | A | B | A | B | [A | B | B] |

Fig. 29

```
Mv Offset=8N
           0  1  2  3  4  5  6  7  8  9  10 11 12 13 14 15 16
Original   A  B  A  B  B  A  B  A  A  B  A  B  B  A  B  A  A
Reordered  0  1  2  3  5  4  7  6  8  9  9  11 13 12 15 14 16
           A  B  A  B  A  B  A  B  A  B  A  B  A  B  A Mv Offset=8N+1
           1  2  3  4  5  6  7  8  9  10 11 12 13 14 15 16 17
Original   B  A  B  B  A  B  A  A  B  A  B  B  A  B  A  A  B
Reordered  2  1  5  3  7  4  8  6  10 9  13 11 15 12 16 14 17
           A  B  A  B  A  B  A  B  A  B  A  B  A  B  A  B  B Mv Offset=8N+2
           2  3  4  5  6  7  8  9  10 11 12 13 14 15 16 17 18
Original   A  B  B  A  B  A  A  B  A  B  B  A  B  A  A  B  A
Reordered  2  3  5  4  7  6  8  9  10 11 13 12 15 14 16 17 18
           A  B  A  B  A  B  A  B  A  B  A  B  A  B  A  B  A Mv Offset=8N+3
           3  4  5  6  7  8  9  10 11 12 13 14 15 16 17 18 19
Original   B  B  A  B  A  A  B  A  B  B  A  B  A  A  B  A  B
Reordered  5  3  7  4  8  6  10 9  13 11 15 12 16 14 18 17 19
           A  B  A  B  A  B  A  B  A  B  A  B  A  B  A  B  B Mv Offset=8N+4
           4  5  6  7  8  9  10 11 12 13 14 15 16 17 18 19 20
Original   B  A  B  A  A  B  A  B  B  A  B  A  A  B  A  B  B
Reordered  5  4  7  6  8  9  10 11 13 12 15 14 16 17 18 19 20
           A  B  A  B  A  B  A  B  A  B  A  B  A  B  A  B  B Mv Offset=8N+5
           5  6  7  8  9  10 11 12 13 14 15 16 17 18 19 20 21
Original   A  B  A  A  B  A  B  B  A  B  A  A  B  A  B  B  A
Reordered  5  6  7  9  8  11 10 12 13 14 15 17 16 19 18 20 21
           A  B  A  B  A  B  A  B  A  B  A  B  A  B  A  B  A Mv Offset=8N+6
           6  7  8  9  10 11 12 13 14 15 16 17 18 19 20 21 22
Original   B  A  A  B  A  B  B  A  B  A  A  B  A  B  B  A  B
Reordered  7  6  8  9  10 11 13 12 15 14 16 17 18 19 21 20 22
           A  B  A  B  A  B  A  B  A  B  A  B  A  B  A  B  B Mv Offset=8N+7
           7  8  9  10 11 12 13 14 15 16 17 18 19 20 21 22 23
Original   A  A  B  A  B  B  A  B  A  A  B  A  B  B  A  B  A
Reordered  7  9  8  11 10 12 13 14 15 17 16 19 18 20 21 22 23
           A  B  A  B  A  B  A  B  A  B  A  B  A  B  A  B  A
```

Fig. 30

```
Mv Offset=4N
          0   2   4   6   8  10  12  14  16  18  20  22  24  26  28  30  32
Original  A   A   B   B   A   A   B   B   A   A   B   B   A   A   B   B   A
Reordered 0   4   2   6   8  12  10  14  16  20  18  22  24  28  26  30  32
          A   B   A   B   A   B   A   B   A   B   A   B   A   B  [A   B   A]

Mv Offset=4N+1
          2   4   6   8  10  12  14  16  18  20  22  24  26  28  30  32  34
Original  A   B   B   A   A   B   B   A   A   B   B   A   A   B   B   A   A
Reordered 2   4   8   6  10  12  16  14  18  20  24  22  26  28  32  30  34
          A   B   A   B   A   B   A   B   A   B   A   B   A   B  [A   B   A]

Mv Offset=4N+2
          4   6   8  10  12  14  16  18  20  22  24  26  28  30  32  34  36
Original  B   B   A   A   B   B   A   A   B   B   A   A   B   B   A   A   B
Reordered 8   4  10   6  16  12  18  14  24  20  26  22  32  28  34  30  36
          A   B   A   B   A   B   A   B   A   B   A   B   A   B  [A   B   B]

Mv Offset=4N+3
          6   8  10  12  14  16  18  20  22  24  26  28  30  32  34  36  38
Original  B   A   A   B   B   A   A   B   B   A   A   B   B   A   A   B   B
Reordered 8   6  10  12  16  14  18  20  24  22  26  28  32  30  34  36  38
          A   B   A   B   A   B   A   B   A   B   A   B   A   B  [A   B   B]
```

Fig. 31

```
Mv Offset=4N
          1   3   5   7   9  11  13  15  17  19  21  23  25  27  29  31  33
Original  B   B   A   A   B   B   A   A   B   B   A   A   B   B   A   A   B
Reordered 5   1   7   3  13   9  15  11  21  17  23  19  29  25  31  27  33
          A   B   A   B   A   B   A   B   A   B   A   B   A   B  [A   B   B]

Mv Offset=4N+1
          3   5   7   9  11  13  15  17  19  21  23  25  27  29  31  33  35
Original  B   A   A   B   B   A   A   B   B   A   A   B   B   A   A   B   B
Reordered 5   3   7   9  13  11  15  17  21  19  23  25  29  27  31  33  35
          A   B   A   B   A   B   A   B   A   B   A   B   A   B  [A   B   B]

Mv Offset=4N+2
          5   7   9  11  13  15  17  19  21  23  25  27  29  31  33  35  37
Original  A   A   B   B   A   A   B   B   A   A   B   B   A   A   B   B   A
Reordered 5   9   7  11  13  17  15  19  21  25  23  27  29  33  31  35  37
          A   B   A   B   A   B   A   B   A   B   A   B   A   B  [A   B   A]

Mv Offset=4N+3
          7   9  11  13  15  17  19  21  23  25  27  29  31  33  35  37  39
Original  A   A   B   B   A   A   B   B   A   A   B   B   A   A   B   B   A
Reordered 7   9  13  11  15  17  21  19  23  25  29  27  31  33  37  35  39
          A   B   A   B   A   B   A   B   A   B   A   B   A   B  [A   B   A]
```

Fig. 32

```
Mv Offset=8N
            0   1   2   3   4   5   6   7   8   9  10  11  12  13  14  15  16
Original    B   A   A   B   B   A   A   B   B   A   A   B   B   A   A   B   B
Reordered   1   0   2   3   5   4   6   7   9   8  10  11  13  12  14  15  16
            A   B   A   B   A   B   A   B   A   B   A   B   A   B | A   B   A |

Mv Offset=8N+1
            1   2   3   4   5   6   7   8   9  10  11  12  13  14  15  16  17
Original    A   A   B   B   A   A   B   B   A   A   B   B   A   A   B   B   A
Reordered   1   3   2   4   5   7   6   8   9  11  10  12  13  15  14  16  17
            A   B   A   B   A   B   A   B   A   B   A   B   A   B | A   B   A |

Mv Offset=8N+2
            2   3   4   5   6   7   8   9  10  11  12  13  14  15  16  17  18
Original    A   B   B   A   A   B   B   A   A   B   B   A   A   B   B   A   A
Reordered   2   3   5   4   6   7   9   8  10  11  13  12  14  15  17  17  18
            A   B   A   B   A   B   A   B   A   B   A   B   A   B | A   B   A |

Mv Offset=8N+3
            3   4   5   6   7   8   9  10  11  12  13  14  15  16  17  18  19
Original    B   B   A   A   B   B   A   A   B   B   A   A   B   B   A   A   B
Reordered   5   3   6   4   9   7  10   8  13  11  14  12  17  15  18  16  19
            A   B   A   B   A   B   A   B   A   B   A   B   A   B | A   B   B |

Mv Offset=8N+4
            4   5   6   7   8   9  10  11  12  13  14  15  16  17  18  19  20
Original    B   A   A   B   B   A   A   B   B   A   A   B   B   A   A   B   B
Reordered   5   4   6   7   9   8  10  11  13  12  14  15  17  16  18  19  20
            A   B   A   B   A   B   A   B   A   B   A   B   A   B | A   B   B |

Mv Offset=8N+5
            5   6   7   8   9  10  11  12  13  14  15  16  17  18  19  20  21
Original    A   A   B   B   A   A   B   B   A   A   B   B   A   A   B   B   A
Reordered   5   7   6   8   9  11  10  12  13  15  14  16  17  19  18  20  21
            A   B   A   B   A   B   A   B   A   B   A   B   A   B | A   B   A |

Mv Offset=8N+6
            6   7   8   9  10  11  12  13  14  15  16  17  18  19  20  21  22
Original    A   B   B   A   A   B   B   A   A   B   B   A   A   B   B   A   A
Reordered   6   7   9   8  10  11  13  12  14  15  17  16  18  19  21  20  22
            A   B   A   B   A   B   A   B   A   B   A   B   A   B | A   B   A |

Mv Offset=8N+7
            7   8   9  10  11  12  13  14  15  16  17  18  19  20  21  22  23
Original    B   B   A   A   B   B   A   A   B   B   A   A   B   B   A   A   B
Reordered   9   7  10   8  13  11  14  12  17  15  18  16  21  19  22  20  23
            A   B   A   B   A   B   A   B   A   B   A   B   A   B | A   B   B |
```

Fig. 33

```
Mv Offset=4N
            0   2   4   6   8  10  12  14  16  18  20  22  24  26  28  30  32
 Original   B   A   B   A   B   A   B   A   B   A   B   A   B   A   B   A   B
 Reordered  2   0   6   4  10   8  14  12  18  16  22  20  26  24  30  28  32
            A   B   A   B   A   B   A   B   A   B   A   B   A   B  [A   B   B]

Mv Offset=4N+1
            2   4   6   8  10  12  14  16  18  20  22  24  26  28  30  32  34
 Original   A   B   A   B   A   B   A   B   A   B   A   B   A   B   A   B   A
 Reordered  2   4   6   8  10  12  14  16  18  20  22  24  26  28  30  32  34
            A   B   A   B   A   B   A   B   A   B   A   B   A   B  [A   B   A]

Mv Offset=4N+2
            4   6   8  10  12  14  16  18  20  22  24  26  28  30  32  34  36
 Original   B   A   B   A   B   A   B   A   B   A   B   A   B   A   B   A   B
 Reordered  6   4  10   8  14  12  18  16  22  20  26  24  30  28  34  32  36
            A   B   A   B   A   B   A   B   A   B   A   B   A   B  [A   B   B]

Mv Offset=4N+3
            6   8  10  12  14  16  18  20  22  24  26  28  30  32  34  36  38
 Original   A   B   A   B   A   B   A   B   A   B   A   B   A   B   A   B   A
 Reordered  6   8  10  12  14  16  18  20  22  24  26  28  30  32  34  36  38
            A   B   A   B   A   B   A   B   A   B   A   B   A   B  [A   B   A]
```

Fig. 34

```
Mv Offset=4N
            1   3   5   7   9  11  13  15  17  19  21  23  25  27  29  31  33
 Original   A   B   A   B   A   B   A   B   A   B   A   B   A   B   A   B   A
 Reordered  1   3   5   7   9  11  13  15  17  19  22  23  25  27  29  31  33
            A   B   A   B   A   B   A   B   A   B   A   B   A   B  [A   B   A]

Mv Offset=4N+1
            3   5   7   9  11  13  15  17  19  21  23  25  27  29  31  33  35
 Original   B   A   B   A   B   A   B   A   B   A   B   A   B   A   B   A   B
 Reordered  5   3   9   7  13  11  17  15  21  19  25  23  29  27  33  31  35
            A   B   A   B   A   B   A   B   A   B   A   B   A   B  [A   B   A]

Mv Offset=4N+2
            5   7   9  11  13  15  17  19  21  23  25  27  29  31  33  35  37
 Original   A   B   A   B   A   B   A   B   A   B   A   B   A   B   A   B   A
 Reordered  5   7   9  11  13  15  17  19  21  23  25  27  29  31  33  35  37
            A   B   A   B   A   B   A   B   A   B   A   B   A   B  [A   B   A]

Mv Offset=4N+3
            7   9  11  13  15  17  19  21  23  25  27  29  31  33  35  37  39
 Original   B   A   B   A   B   A   B   A   B   A   B   A   B   A   B   A   B
 Reordered  9   7  13  11  17  15  21  19  25  23  29  27  33  31  37  35  39
            A   B   A   B   A   B   A   B   A   B   A   B   A   B  [A   B   B]
```

Fig. 35

A-BANK 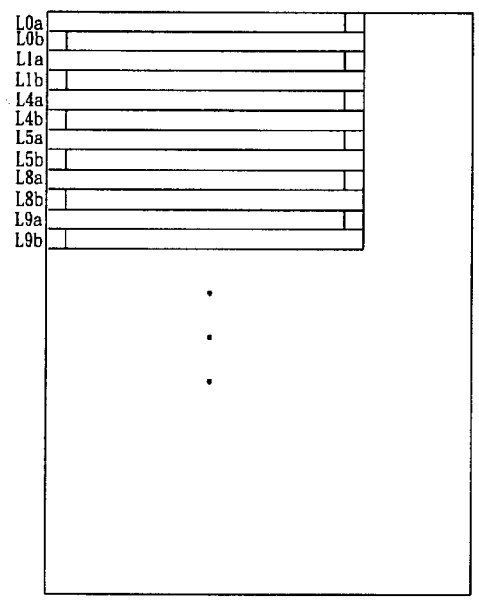 B-BANK 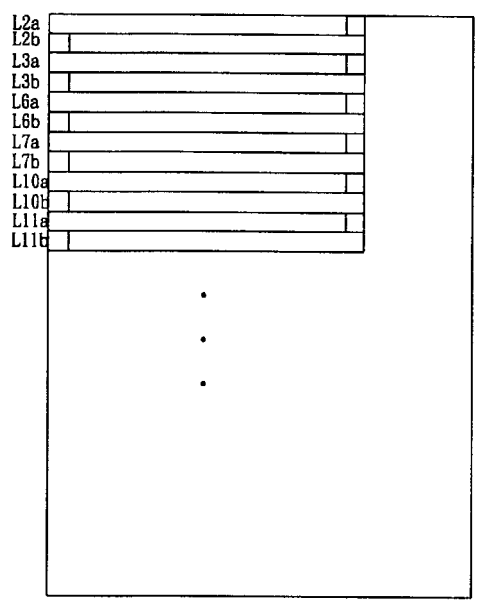
Fig. 37

A-BANK

| LINE0 | 512byte |
|---|---|
| 208byte LINE1 | 304byte |
| 416byte | LINE4 96byte |
| LINE5 | 512byte |
| 102byte LINE8 | 410byte |

B-BANK

| LINE0 | 512byte |
|---|---|
| 208byte LINE1 | 304byte |
| 416byte | LINE4 96byte |
| LINE5 | 512byte |
| 102byte LINE8 | 410byte |

Fig. 38

ARCHITECTURE FOR VIDEO COMPRESSOR TO EFFICIENTLY ADDRESS SYNCHRONOUS MEMORY

BACKGROUND OF THE INVENTION

1. Field of the Invention

The present invention relates to the field of video decompressing and, more particularly, to an architecture for video decompressor to efficiently access synchronous memory.

2. Description of Related Art

With the progress of the digital electronic technique, the use of the digitized video data has greatly increased the convenience in enjoying a video article. However, the size of the digitized video data is always so tremendous, and thus, the data must be compressed to reduce its size for transmission or storage. For those skilled in the art, there are several well-known practical video compressing standards, for example, the JPEG, MPEG1, MPEG2, MPEG4 and H.26X.

It is known that a similarity is generally existed between the front and end portions of the video data, so that there is a redundancy in the video data. Therefore, some of the compressing standards utilize an algorithm to remove such a time redundancy, so as to compress the video data. For example, the MPEG system utilizes a motion compensation method to achieve the purpose of data compressing. In a typical MPEG2 application, if the video data to be decompressed is of NTSC format, the size of data required to be processed is 720×480×1.5×(17×17)/(16×16) bits. Further for processing the data for reading and displaying the bitstream, and system application, the total data bandwidth required is much more than 100M bytes/sec. However, the most economic amount of memory used in the MPEG2 MP@ML standard is 16M bits. Therefore, neither the fast page mode DRAM (Dynamic Random Access Memory) nor the EDO (Extended Data Out) DRAM can meet such a memory requirement.

Currently, the synchronous DRAM (hereinafter abbreviated as SRAM) is getting popular, which provides a larger bandwidth; for example, the 16-bit SDRAM has a bandwidth more than 100 words/sec. In use of the SDRAM, the best data access performance is achieved by alternately accessing the A-bank and B-bank of the SDRAM. Otherwise, the memory banks of the SDRAM must be pre-charged, which results in a waste of more than six operating cycles. Therefore, it is desirable to fully utilize the bandwidth of the SDRAM to promote the memory access efficiency for a video decompressor.

SUMMARY OF THE INVENTION

The object of the present invention is to provide an architecture for video decompressor to efficiently access synchronously memory, which always performs memory operations by alternately accessing the A-bank and B-bank, so as to effectively utilize the bandwidth of the SDRAM thereby significantly increasing the memory access efficiency.

According to one aspect, the present invention which achieves the object relates to an architecture for video decompressor to efficiently access synchronous memory, comprising a synchronous memory device having an A-bank and B-bank for being stored with image data, and a memory controller for controlling data access to the synchronous memory to perform motion compensation and display. The image data has a plurality of scan lines and every four scan lines are grouped for being periodically arranged in the synchronous memory in such a manner that the A-bank is sequentially stored with (4N+0)-th and (4N+1)-th scan lines, and the B-bank is sequentially stored with the (4N+2)-th and (4N+3)-th scan lines, where N is a non-negative integer.

According to another aspect, the present invention which achieves the object relates to an architecture for video decompressor to efficiently access synchronous memory, comprising a synchronous memory device having an A-bank and B-bank for being stored with image data, and a memory controller for controlling data access to the synchronous memory to perform motion compensation and display. The image data has a plurality of luminance scan lines and every eight scan lines are grouped for being periodically arranged in the synchronous memory in such a manner that the A-bank is sequentially stored with (8N+0)-th, (8N+1)-th, (8N+6)-th and (8N+7)-th scan lines, and the B-bank is sequentially stored with the (8N+2)-th, (8N+3)-th, (8N+4)-th and (8N+5)-th scan lines, where N is a non-negative integer. The image data has a plurality of chrominance scan lines and every eight scan lines are grouped for being periodically arranged in such a manner that the A-bank is sequentially stored with (8N+1)-th, (8N+2)-th, (8N+5)-th and (8N+6)-th scan lines, and the B-bank is sequentially stored with (8N+0)-th, (8N+3)-th, (8N+4)-th and (8N+7)-th scan lines, where N is a non-negative integer.

According to a further aspect, the present invention which achieves the object relates to an architecture for video decompressor to efficiently access synchronous memory, comprising a synchronous memory device having an A-bank and B-bank for being stored with image data, and a memory controller for controlling data access to the synchronous memory to perform motion compensation and display. The image data has a plurality of luminance scan lines and every eight scan lines are grouped for being periodically arranged in the synchronous memory in such a manner that the A-bank is sequentially stored with (8N+0)-th, (8N+2)-th, (8N+5)-th and (8N+7)-th scan lines, and the B-bank is sequentially stored with the (8N+1)-th, (8N+3)-th, (8N+4)-th and (8N+6)-th scan lines, where N is a non-negative integer. The image data has a plurality of chrominance scan lines and every eight scan lines are grouped for being periodically arranged in such a manner that the A-bank is sequentially stored with (8N+1)-th, (8N+2)-th, (8N+5)-th and (8N+6)-th scan lines, and the B-bank is sequentially stored with (8N+0)-th, (8N+3)-th, (8N+4)-th and (8N+7)-th scan lines, where N is a non-negative integer.

Other objects, advantages, and novel features of the invention will become more apparent from the following detailed description when taken in conjunction with the accompanying drawings.

BRIEF DESCRIPTION OF THE DRAWINGS

FIG. 5 schematically illustrates the arrangement of the scan lines in the A-bank and b-bank of the synchronous memory;

FIG. 6 schematically illustrates the order of the scan lines of the reference macroblock to be read for performing motion compensation in the frame prediction mode;

FIG. 7 schematically illustrates the order of the scan lines of the reference macroblock to be read for performing motion compensation to the top field in the field prediction mode;

FIG. 8 schematically illustrates the order of the scan lines of the reference macroblock to be read for performing motion compensation to the bottom field in the field prediction mode;

FIG. 9 schematically illustrates an adjustment operation in reading the synchronous memory;

FIG. 21 schematically illustrates the display of luminance data and chrominance data read from the synchronous memory by repeating the chrominance data;

FIG. 22 schematically illustrates the arrangement of the luminance scan lines in the synchronous memory when the chrominance data is repeated with the field repeat method;

FIG. 23 schematically illustrates the arrangement of the chrominance scan lines in the synchronous memory when the chrominance data is repeated with the field repeat method;

FIG. 24 schematically illustrates a display order when the chrominance data is repeated with field repeat method;

FIG. 25 schematically illustrates another display order when the chrominance data is repeated with field repeat method;

FIG. 26 schematically illustrates the arrangement of the luminance scan lines in the synchronous memory when the chrominance data is repeated with the line repeat method;

FIG. 27 schematically illustrates the order of the luminance scan lines of the reference macroblock to be read for performing motion compensation in the frame prediction mode and when the chrominance data is repeated with the field repeat method;

FIG. 28 schematically illustrates the order of the luminance scan lines of the reference macroblock to be read for performing motion compensation to the top field in the field prediction mode and when the chrominance data is repeated with the field repeat method;

FIG. 29 schematically illustrates the order of the luminance scan lines of the reference macroblock to be read for performing motion compensation to the bottom field in the field prediction mode and when the chrominance data is repeated with the field repeat method;

FIG. 30 schematically illustrates the order of the luminance scan lines of the reference macroblock to be read for performing motion compensation in the frame prediction mode and when the chrominance data is repeated with the line repeat method;

FIG. 31 schematically illustrates the order of the luminance scan lines of the reference macroblock to be read for performing motion compensation to the top field in the field prediction mode and when the chrominance data is repeated with the line repeat method;

FIG. 32 schematically illustrates the order of the luminance scan lines of the reference macroblock to be read for performing motion compensation to the bottom field in the field prediction mode and when the chrominance data is repeated with the line repeat method;

FIG. 33 schematically illustrates the order of the chrominance scan lines of the reference macroblock to be read for performing motion compensation in the frame prediction mode;

FIG. 34 schematically illustrates the order of the chrominance scan lines of the reference macroblock to be read for performing motion compensation to the top field in the field prediction mode;

FIG. 35 schematically illustrates the order of the chrominance scan lines of the reference macroblock to be read for performing motion compensation to the bottom field in the field prediction mode;

FIG. 37 schematically illustrates the layout of the scan lines in a 16M-bit SDRAM; and FIG. 38 schematically illustrates the layout of the scan lines in a SDRAM wherein the scan lines are stored in a linear address mode.

DETAILED DESCRIPTION OF THE PREFERRED EMBODIMENT

Figure 1:
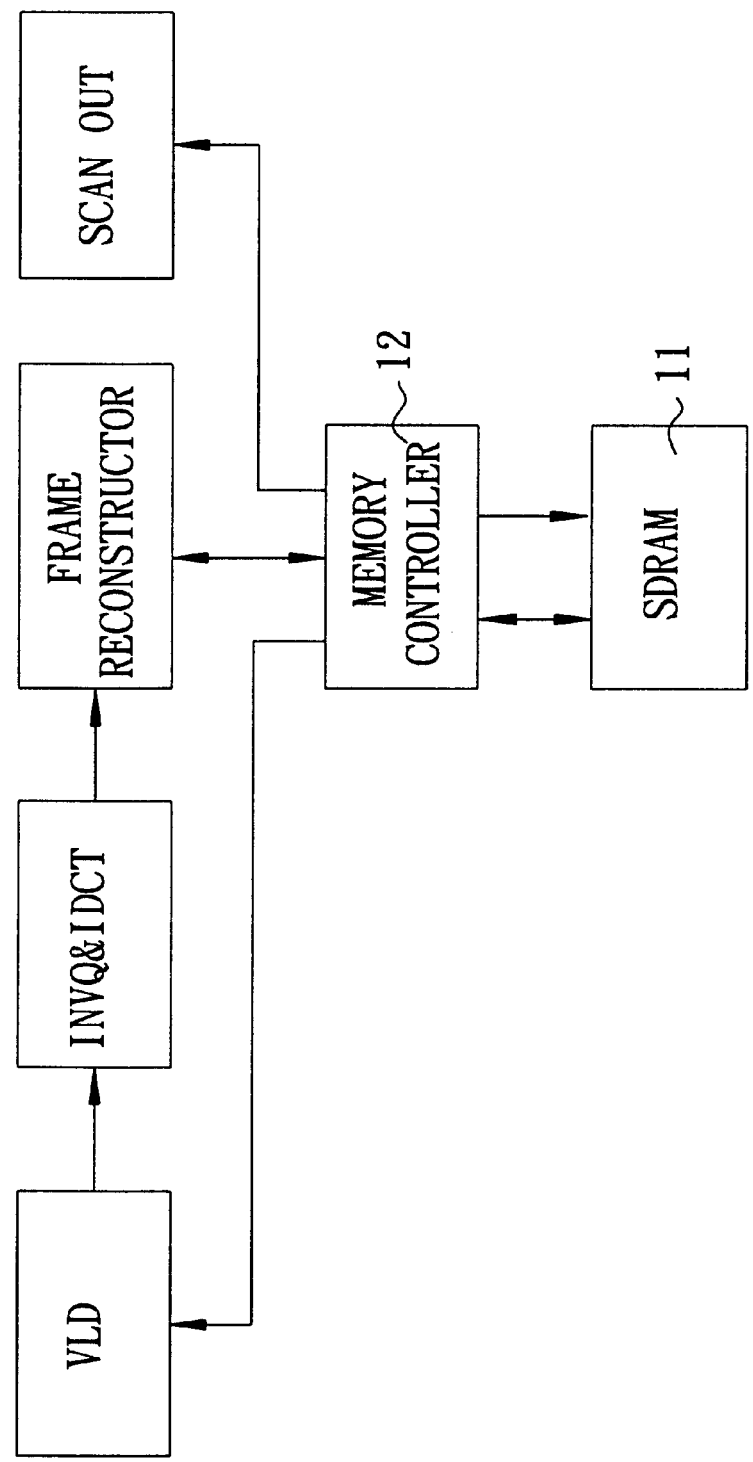
FIG. 1 is a system block diagram of the architecture for video decompressor to efficiently access synchronous memory in accordance with the present invention.

FIG. 1 schematically illustrates a preferred embodiment of the architecture for video decompressor to efficiently access synchronously memory in accordance with the present invention, wherein a memory device 11 composed of SDRAM is provided to store video data. When data is decompressed, a memory controller 12 controls the access operation of the memory device 11, so as to read data from the memory device 11 for performing the variable length decode (VLD), and inverse quantization & inverse discrete cosine transform (INVQ&IDCT) processes. Furthermore, a frame reconstructor 13 is controlled by the memory controller 12 to read the macroblock in the reference video frame and the difference of macroblocks from the INVQ&IDCT process, so as to perform a motion compensation process. Then, the recovered macroblock is stored back to the memory device 11. Herein, because a half pixel interpolation method is employed in the motion compensation process, the read data is of 17×17 pixels, while the compensated data for being stored into the memory device 11 is of 16×16 pixels. Accordingly, the recovered data is provided for scan out to be displayed.

Figure 2:
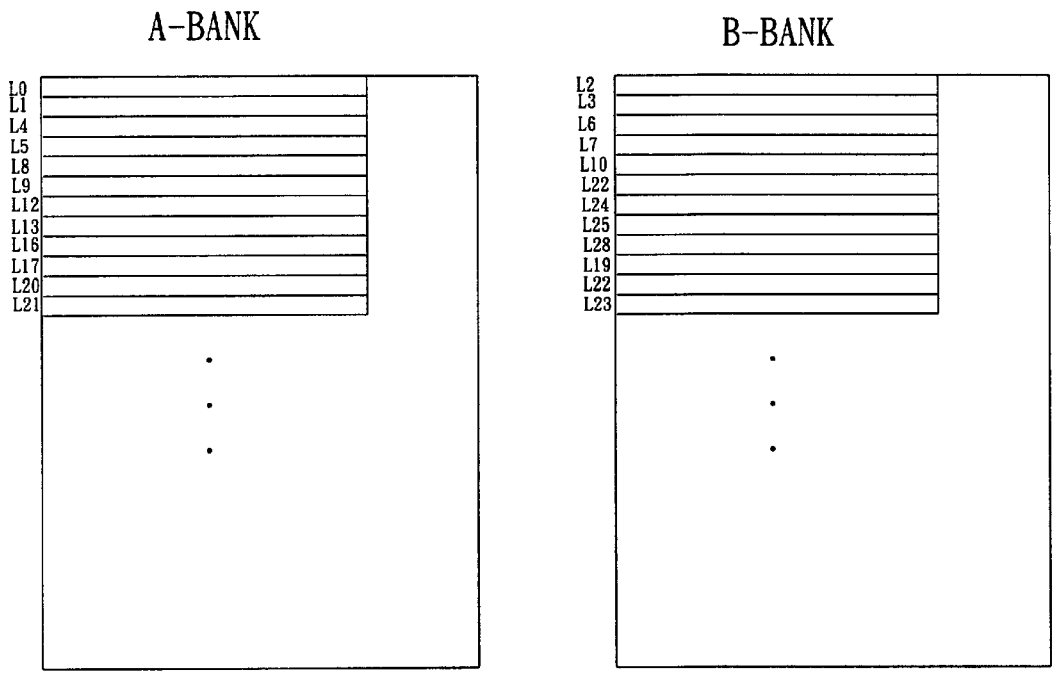
FIG. 2 schematically illustrates the relation between the scan lines of the reference picture and the memory banks of the synchronous memory.
Figure 3:
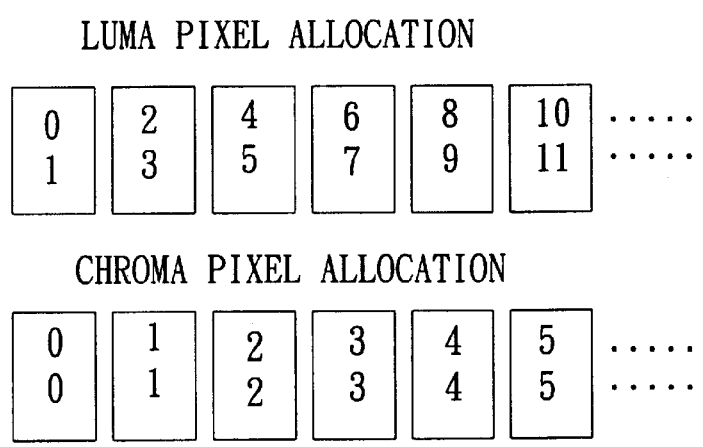
FIG. 3 schematically illustrates the content of a memory location in the synchronous memory.

With the above system architecture to perform video decoding, the scan lines (L0, L1, L2, L3, L4, L5 . . . ) of the required reference picture are typically stored in the AB-banks of the SDRAM as shown in FIG. 2. The pixel allocation in the SDRAM is illustrated in FIG. 3, for the luminance pixel allocation, one memory location is stored with two adjacent luminance pixels of the picture, and, for the chrominance pixel allocation, one memory location is stored with a Cb pixel combined with a Cr pixel.

Figure 4:
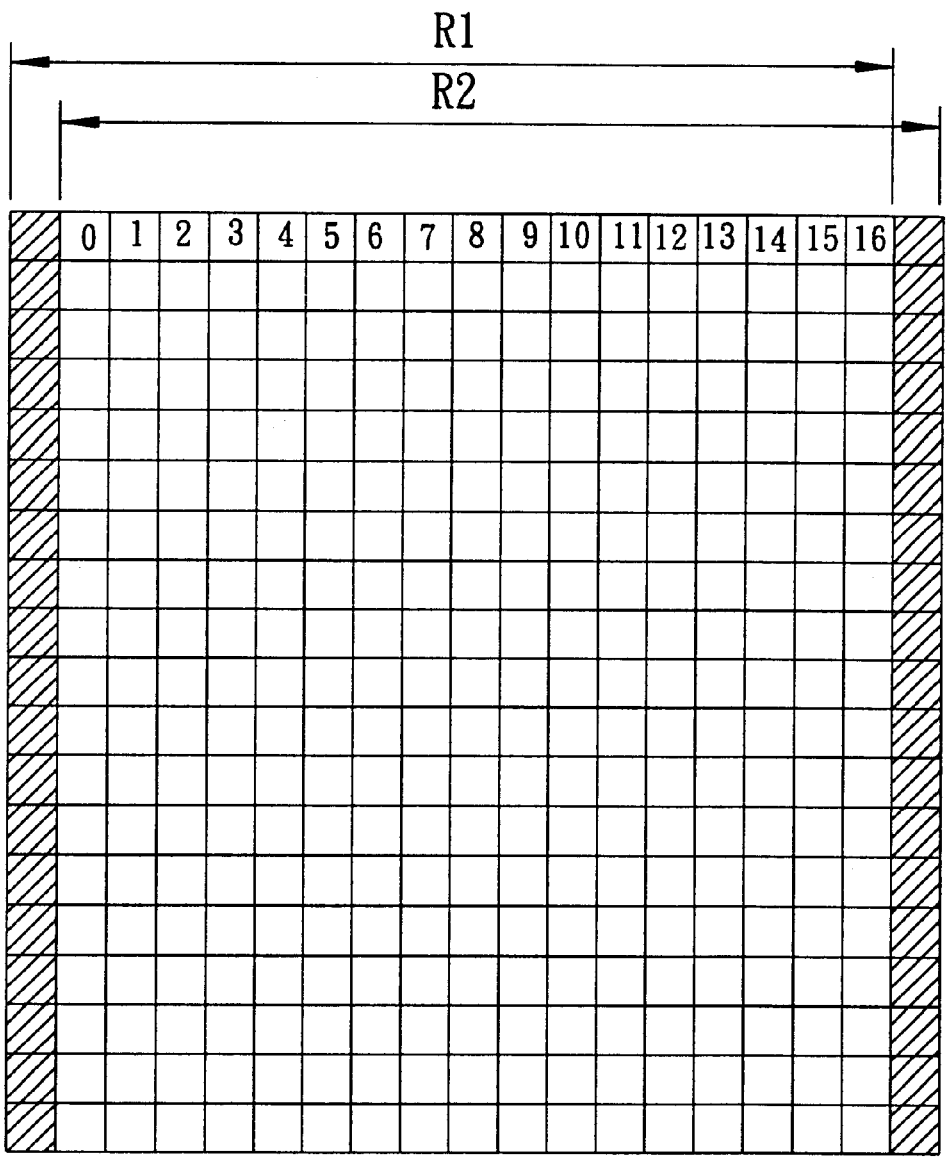
FIG. 4 schematically illustrates a reference macroblock read from synchronous memory for decompressing.

In this preferred embodiment, memory access is assumed to be performed by taking 16 bits as an unit. Therefore, with reference to FIG. 4, the required reference block, which is of 17×17 pixels, for video decoding are actually read form 9 words of 17 rows, as denoted by R1 and R2, in the SDRAM, where each word has 16 bits. The read of these 17 data segments is varied depending on the motion vector (MV) and the prediction mode. FIG. 5 illustrates the layout arrangement of the scan lines of the picture in the AB-banks of the SDRAM, wherein every four scan lines are grouped for being periodically arranged. In details, the A-bank is sequentially stored with the (4N+0)-th and (4N+1)-th scan lines, and the B-bank is sequentially stored with the (4N+2)-th and (4N+3)-th scan lines, where N is a non-negative integer.

When the frame prediction mode is employed for reading reference blocks to perform motion compensation, as shown in FIG. 6, an alternate access to the A-bank and B-bank of the SDRAM can not be achieved if the 17 data segments are read out in an original order. Therefore, also as shown in FIG. 6, the 17 data segments are reordered to correspond to the AB-banks in an alternate manner when the MV offset is 4N, 4N+1, 4N+2 or 4N+3, wherein the last three data segments have an arrangement of ABA. Preferably, the reorder is accomplished by using a starting line and the layout arrangement as shown in FIG. 5 to sequentially output lines that are arranged in an order of A-B, A-B banks. An exemplary reorder algorithm is given as follows:

```
/*** Algorithm RE-ORDER ***/
Algorithm RE-ORDER
begin
    line_count := 0;
    repeat
    begin
    for (all lines in bank-A) do
    begin
        pick up the line with smallest line number, L_A;
        L := L_A;
        output L;
        remove L_A from Φ_A;
        line_count := line_count + 1;
    end
    for (all lines in bank-B) do
    begin
        pick up the line with smallest line number, L_B;
        L := L_B;
        output L;
        remove L_B from Φ_B;
        line_count := line_count + 1;
    end
```

-continued

```
end
    until (line_count=17);
end
/*** End of Algorithm ***/
```

The algorithm utilizes two sets $\Phi_A$ and $\Phi_B$, that are formed by all lines of the A-bank and B-bank in an ascending order, respectively. The line with a minimum line number in the set of A-bank is first retrieved for output and then removed. Next, the line with a minimum line number in the set of B-bank is retrieved for output and then removed. As such, by alternately operating on A-B banks, all 17 lines can be output.

If the field prediction mode is employed for reading reference blocks to perform motion compensation, FIGS. 7 and 8 show the order of the arranged data segments in the top field and bottom field, respectively. As shown, an alternate access to the A-bank and B-bank of the SDRAM can be achieved in reading the 17 data segments when the MV offset is 0, so that a reorder is not necessary. However, when the MV offset is 0, an alternate access to the A-bank and B-bank of the SDRAM can not be achieved if the 17 data segments are read out in an original order, Similarly, the 17 data segments can be reordered by the reorder algorithm to correspond to the AB-banks in an alternate manner, wherein the last three data segments have an arrangement of ABA or ABB.

As to the 'ABA' or 'ABB' arrangement of the last three data segments, it may defect the alternate memory access manner and result in a waste of bandwidth due to the additional pre-charge cycles in the SDRAM read/write timing. Therefore, with reference to FIG. 9, the original read operation to 9A-9B-9A, where 9A and 9B denote the 9 words of the AB-banks, respectively, can be tuned to a read operation to 9A-4B-9A-5B (or 9A-5B-9A-4B) by splitting the reading of 9B into a reading of 4B and a reading of 5B (i.e., a reading of 4 words in B-bank and a reading of 5 words in B-bank). Similarly, the original read operation to 9A-9B-9B can be tuned to a read operation to 4A-9B-5A-9B (or 5A-9B-4A-9B) by splitting the reading of 9A into a reading of 4A and a reading of 5A. Accordingly, an alternate access to the A bank and B bank of the SDRAM can be achieved and the memory read operation is always terminated on the B-bank, thereby completely eliminating the possibility of defecting the alternate memory access manner.

Figure 10:
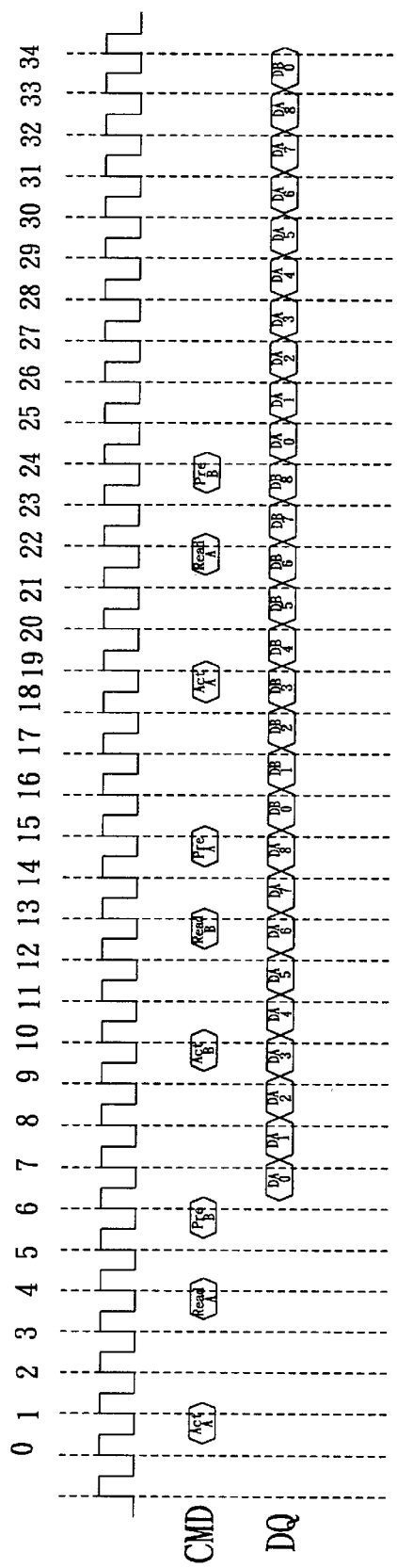
FIG. 10 is a timing diagram for performing a SDRAM read operation in a manner of 9A-9B-9A-9B at CAS Latency=3 & Burst Length=Full.
Figure 11:
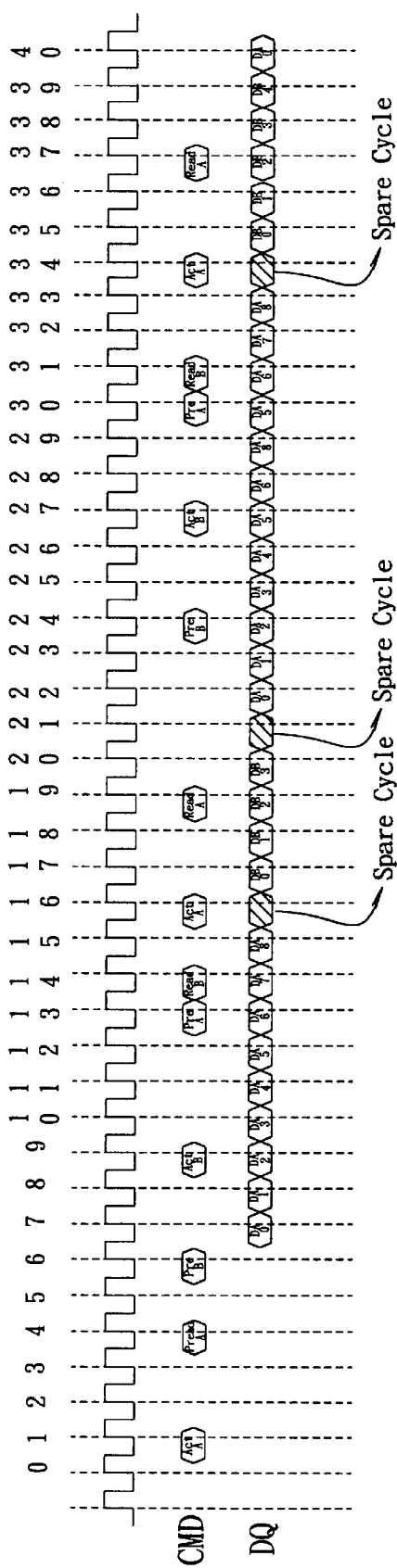
FIG. 11 is a timing diagram for performing a SDRAM read operation in a manner of 9A-4B-9A-5B at CAS Latency=3 & Burst Length=Full.
Figure 12:
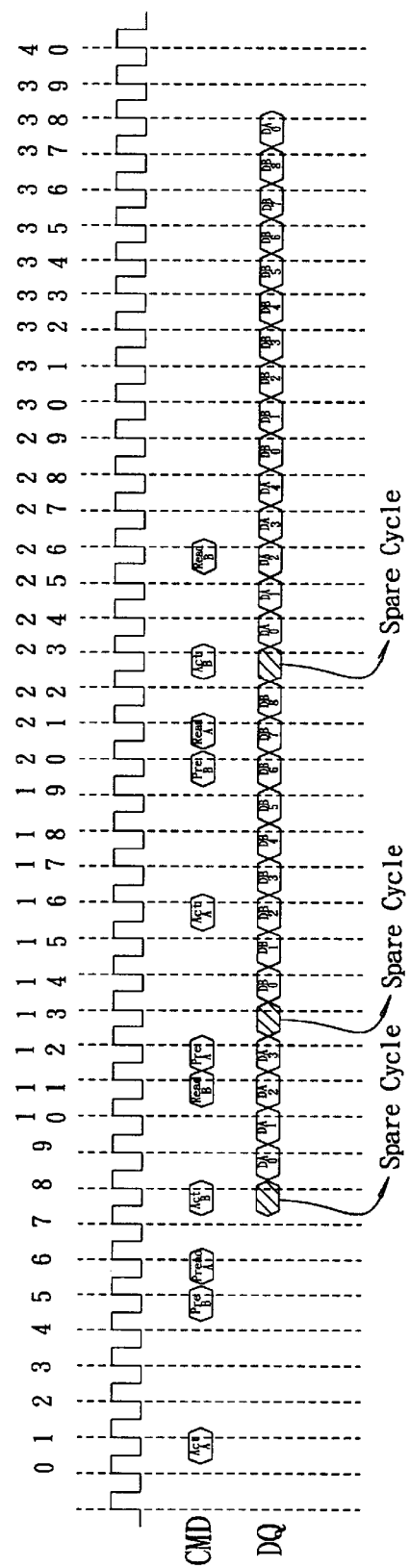
FIG. 12 is a timing diagram for performing a SDRAM read operation in a manner of 4A-9B-5A-9B at CAS Latency=3 & Burst Length=Full.

With reference to FIGS. 10, 11 and 12, there are shown the SDRAM page read timings at CAS Latencyn=3 & Burst Length=Full. FIG. 10 is the timing for performing a SDRAM read operation in a manner of 9A-9B-9A-9B in accordance with the present invention, which illustrates that there is no wasted cycle in the data bus (DQ) of the SDRAM, and thus all the bandwidth is fully utilized. FIG. 11 is the timing for performing a SDRAM read operation in a manner of 9A-4B-9A-5B in accordance with the present invention, which illustrates that there is only three wasted cycle in the data bus of the SDRAM. FIG. 12 is the timing for performing a SDRAM read operation in a manner of 4A-9B-5A-9B in accordance with the present invention, which illustrates that there is also only three wasted cycle in the data bus of the SDRAM. Therefore, in comparison with the conventional method, the number of wasted cycles can be significantly reduced.

Figure 13:
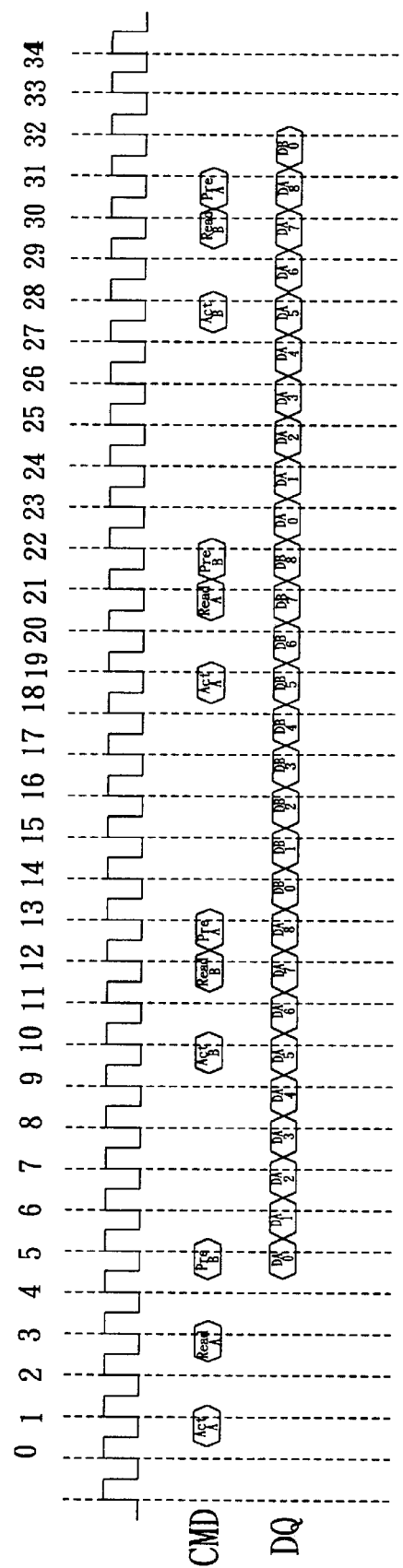
FIG. 13 is a timing diagram for performing a SDRAM read operation in a manner of 9A-9B-9A-9B at CAS Latency=2 & Burst Length=Full.
Figure 14:
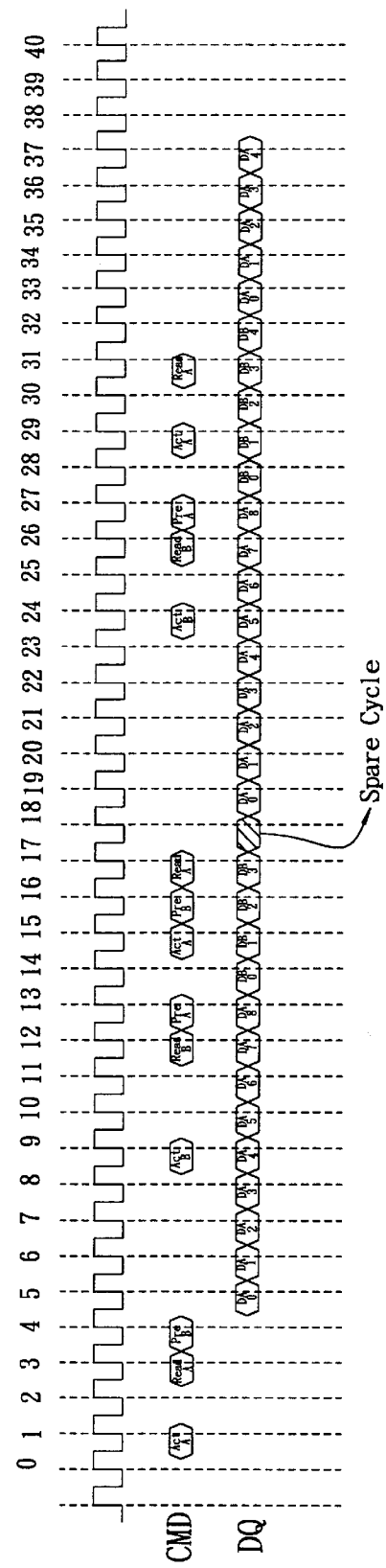
FIG. 14 is a timing diagram for performing a SDRAM read operation in a manner of 9A-4B-9A-5B at CAS Latency=2 & Burst Length=Full.
Figure 15:
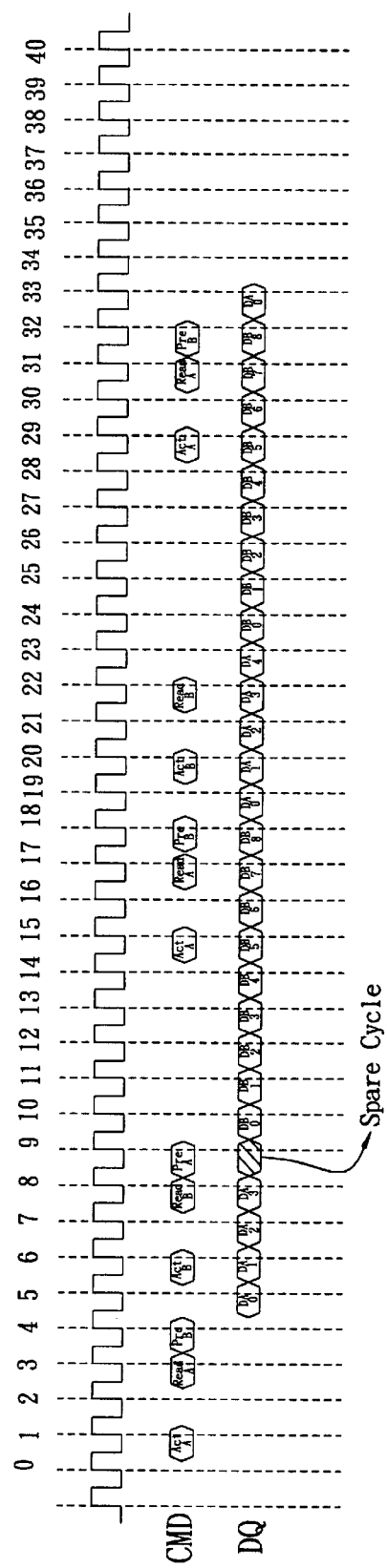
FIG. 15 is a timing diagram for performing a SDRAM read operation in a manner of 4A-9B-5A-9B at CAS Latency=2 & Burst Length=Full.

Similarly, FIGS. 13, 14 and 15 show the SDRAM page read timings at CAS Latency=2 & Burst Length=Full. As shown, there is only one wasted cycle in the data bus of the SDRAM. Therefore, a better SDRAM read performance is provided.

Figure 16:
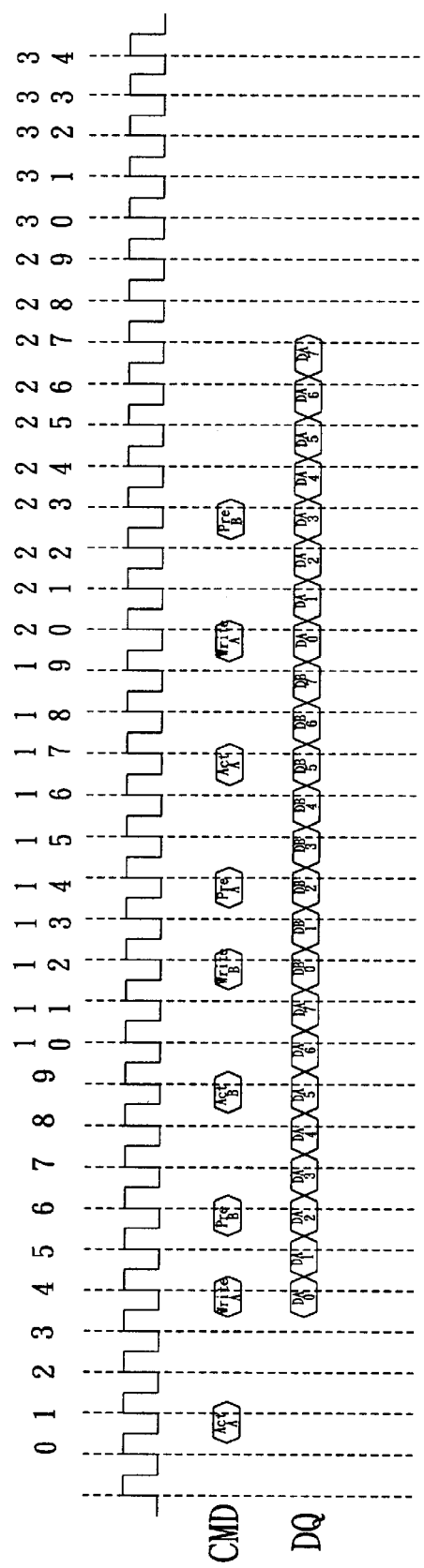
FIG. 16 is a timing diagram for performing a SDRAM write operation after completing the motion compensation.

FIG. 16 is a SDRAM page write timing at CAS Latency=3 & Burst Length=Full for writing compensated image data into the SDRAM in a manner of 8A–8B in accordance with the present invention. As shown, there is no wasted cycle and the bandwidth is fully utilized.

As to the image display, the decoded luminance and chrominance data will be displayed on the TV in a typical video application. One of the most popular display method is based on the CC1R601 standard to display data in a YUVYUV manner. Furthermore, because the sampling rates of the luminance and chrominance data are different, the chrominance data must be repeated for display. The method to repeat the chrominance data may be of line repeat or field repeat.

Figure 17:
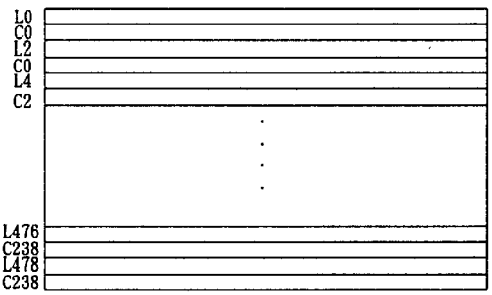
FIG. 17 schematically illustrates the display of the top field by repeating the chrominance data with the line repeat method.
Figure 18:
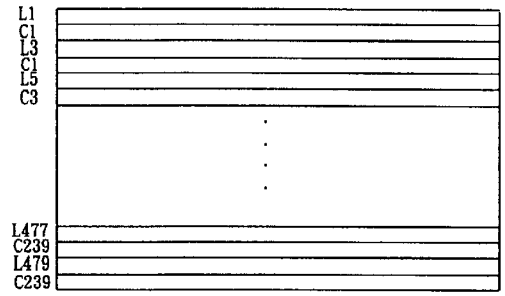
FIG. 18 schematically illustrates the display of the bottom field by repeating the chrominance data with the line repeat method.

When displaying the top field by repeating the chrominance data with the line repeat method, as shown in FIG. 17, the even-numbered lines (C0, C2, C4, . . . , C238) of chrominance data are repeated and corresponding to the even-numbered lines (L0, L2, L4, . . . , L478) of luminance data. When displaying the bottom field, as shown in FIG. 18, the odd-numbered lines (C1, C3, C5, . . . , C239) of chrominance data are repeated and corresponding to the odd-numbered lines (L1, L3, L5, . . . , L479) of luminance data.

Figure 19:
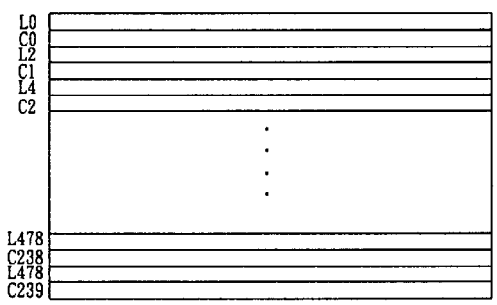
FIG. 19 schematically illustrates the display of the top field by repeating the chrominance data with the field repeat method.
Figure 20:
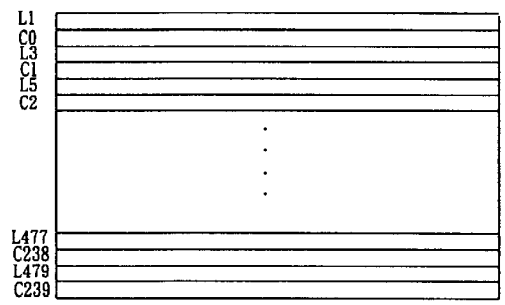
FIG. 20 schematically illustrates the display of the bottom field by repeating the chrominance data with the field repeat method.

When displaying the top field by repeating the chrominance data with the field repeat method, as shown in FIG. 19, all the lines (C0, C1, C2, . . . , C239) of chrominance data of the field are corresponding to the even-numbered lines (L0, L2, L4, . . . , L478) of luminance data. When displaying the bottom field, as shown in FIG. 20, all the lines (C0, C1, C2, . . . , C239) of chrominance data of the field are corresponding to the odd-numbered lines (L1, L3, L5, . . . , L479) of luminance data.

No matter the chrominance data is repeated by line repeat of field repeat, the alternate access manner to the A-bank and B-bank will be defected when displaying image data using the layout arrangement as shown in FIGS. 5 and 6, due to the fact that the luminance data and corresponding chrominance data must be read out continuously from the SDRAM, as illustrated in FIG. 21.

To further enhance the memory access efficiency in displaying the image data, as shown in FIG. 22, the scan lines of luminance data in the AB-banks of the SDRAM are arranged in a manner that every eight scan lines are grouped for being periodically arranged when displaying the image data by repeating the chrominance data with the field repeat method. In details, the A-bank is sequentially stored with the (8N+0)-th,(8N+1)-th, (8N+6)-th and (8N+7)-th scan lines, and the B-bank is sequentially stored with the (8N+2)-th, (8N+3)-th, (8N+4)-th and (8N+5)-th scan lines, where N is a non-negative integer. FIG. 23 shows the arrangement of the scan lines of chrominance data in the AB-banks of the SDRAM. Corresponding to the arrangement of the scan lines of luminance data, the scan lines of chrominance data are arranged in a manner that every eight scan lines are grouped for being periodically arranged, wherein the A-bank is sequentially stored with the (8N+1)-th, (8N+2)-th, (8N+5)-th and (8N+6)-th scan lines, and the B-bank is sequentially stored with the (8N+0)-th, (8N+3)-th, (8N+4)-th and (8N+7)-th scan lines, where N is a non-negative integer.

When reading the (8N+0)-th, (8N+1)-th, (8N+6)-th and (8N+7)-th scan lines for display with the above arrangement of the image data in the SDRAM, the luminance data is read first and then the chrominance data is read, as shown in FIG. 24. When reading the (8N+2)-th, (8N+3)-th, (8N+4)-th and (8N+5)-th scan lines for display, as shown in FIG. 25, the chrominance data is read first and then the luminance data is read. As a result, an alternate access to A-bank and B-bank can be achieved in displaying image data, so as to enhance the memory access efficiency.

When displaying the image data by repeating the chrominance data with the line repeat method, as shown in FIG. 26, the scan lines of luminance data in the AB-banks of the SDRAM are arranged in a manner that every eight scan lines are grouped for being periodically arranged, wherein the A-bank is sequentially stored with the (8N+0)-th, (8N+2)-th, (8N+5)-th and (8N+7)-th scan lines, and the B-bank is sequentially stored with the (8N+1)-th, (8N+3)-th, (8N+4)-th and (8N+6)-th scan lines, where N is a non-negative integer. The arrangement of the scan lines of chrominance data in the AB-banks of the SDRAM is the same as that shown in FIG. 23. That is, corresponding to the arrangement of the scan lines of luminance data, the scan lines of chrominance data are arranged in a manner that every eight scan lines are grouped for being periodically arranged, wherein the A-bank is sequentially stored with the (8N+1)-th, (8N+2)-th, (8N+5)-th and (8N+6)-th scan lines, and the B-bank is sequentially stored with the (8N+0)-th, (8N+3)-th, (8N+4)-th and (8N+7)-th scan lines, where N is a non-negative integer.

When reading the (8N+0)-th, (8N+2)-th, (8N+5)-th and (8N+7)-th scan lines for display with the above arrangement of the image data in the SDRAM, similar to that shown in FIG. 24, the luminance data is read first and then the chrominance data is read. When reading the (8N+1)-th, (8N+3)-th, (8N+4)-th and (8N+6)-th scan lines for display, similar to that shown in FIG. 25, the chrominance data is read first and then the luminance data is read. As a result, an alternate access to A-bank and B-bank can be achieved in displaying image data, so as to enhance the memory access efficiency.

With the arrangement of the field repeat scan lines of luminance data as shown in FIG. 22, it is applicable to achieve an alternate access to A-bank and B-bank when performing motion compensation in a frame prediction mode. With reference to FIG. 27, an alternate access to the A-bank and B-bank of the SDRAM can not be achieved if the 17 data segments are read out in an original order. Therefore, also as shown in FIG. 27, the 17 data segments are reordered, by the aforementioned reorder algorithm, to correspond to the AB-banks in an alternate manner when the MV offset is 8N, 8N+1, 8N+2, 8N+3, 8N+4, 8N+5, 8N+6 or 8N+7, wherein the last three data segments have an arrangement of ABA or ABB, which can be tuned to satisfy the alternate access rule.

When performing motion compensation in a field prediction mode, the read sequences of the scan lines for the top field and bottom field are shown in FIGS. 28 and 29, respectively. As shown, an alternate access to the A-bank and B-bank of the SDRAM can not be achieved if the 17 data segments are read out in an original order. Therefore, also as shown in FIGS. 28 and 29, the 17 data segments are reordered, by the aforementioned reorder algorithm, to correspond to the AB-banks in an alternate manner when the MV offset is 4N, 4N+1, 4N+2 or 4N+3, wherein the last three data segments have an arrangement of ABA or ABB, which can be tuned to satisfy the alternate access rule.

With the arrangement of the line repeat scan lines of luminance data as shown in FIG. 26, it is applicable to achieve an alternate access to A-bank and B-bank when performing motion compensation in a frame prediction mode. With reference to FIG. 30, an alternate access to the A-bank and B-bank of the SDRAM can not be achieved if the 17 data segments are read out in an original order. Therefore, also as shown in FIG. 30, the 17 data segments are reordered, by the aforementioned reorder algorithm, to correspond to the AB-banks in an alternate manner when the MV offset is 8N, 8N+1, 8N+2, 8N+3, 8N+4, 8N+5, 8N+6 or 8N+7, wherein the last three data segments have an arrangement of ABA or ABB, which can be tuned to satisfy the alternate access rule.

When performing motion compensation in a field prediction mode, the read sequences of the scan lines for the top field and bottom field are shown in FIGS. 31 and 32, respectively. As shown, an alternate access to the A-bank and B-bank of the SDRAM can not be achieved if the 17 data segments are read out in an original order. Therefore, also as shown in FIGS. 31 and 32, the 17 data segments are reordered, by the aforementioned reorder algorithm, to correspond to the AB-banks in an alternate manner when the MV offset is 4N, 4N+1, 4N+2 or 4N+3, wherein the last three data segments have an arrangement of ABA or ABB, which can be tuned to satisfy the alternate access rule.

With the arrangement of the scan lines of chrominance data as shown in FIG. 23, it is applicable to achieve an alternate access to A-bank and B-bank when performing motion compensation in a frame prediction mode. With reference to FIG. 33, an alternate access to the A-bank and B-bank of the SDRAM can not be achieved if the 17 data segments are read out in an original order. Therefore, also as shown in FIG. 33, the 17 data segments are reordered, by the aforementioned reorder algorithm, to correspond to the AB-banks in an alternate manner when the MV offset is 8N, 8N+1, 8N+2, 8N+3, 8N+4, 8N+5, 8N+6 or 8N+7, wherein the last three data segments have an arrangement of ABA or ABB, which can be tuned to satisfy the alternate access rule.

When performing motion compensation in a field prediction mode, the read sequences of the scan lines for the top field and bottom field are shown in FIGS. 34 and 35, respectively. As shown, an alternate access to the A-bank and B-bank of the SDRAM can not be achieved if the 17 data segments are read out in an original order. Therefore, also as shown in FIGS. 28 and 29, the 17 data segments are reordered, by the aforementioned reorder algorithm, to correspond to the AB-banks in an alternate manner when the MV offset is 4N, 4N+1, 4N+2 or 4N+3, wherein the last three data segments have an arrangement of ABA or ABB, which can be tuned to satisfy the alternate access rule.

Figure 36:
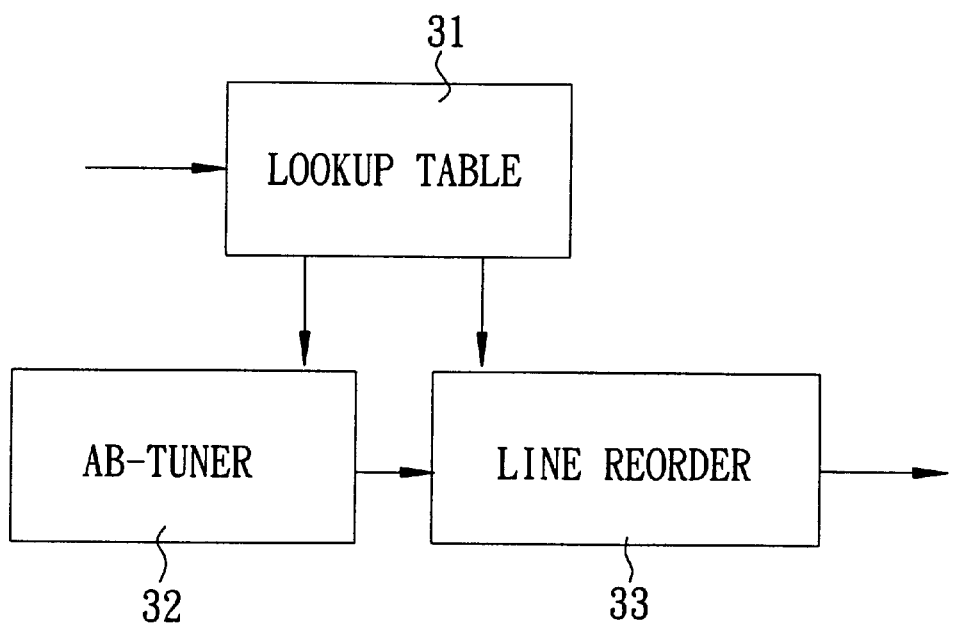
FIG. 36 is a functional block diagram of the memory controller in accordance with the present invention.

The aforementioned reorder and tuning operations are achieved by the memory controller 12. With reference to FIG. 36, the memory controller 12 is implemented with a look-up table 31, an AB-tuner 32 and a line reorder 33. The look-up table 31 is a logic representation of all the aforementioned reorder sequences. A desired reorder sequence can be determined by looking up the table 31 based on the received information, such as the display mode, motion vector, prediction mode, type of image data, and read sequence. The AB-tuner 32 is provided to tune the arrangement of ABA or ABB. As such, the line reorder 33 is able to adjust the order of the scan lines read from the SDRAM based on the output of the look-up table 31 and the AB-tuner 32. Accordingly, the sequence of the scan lines when performing motion compensation is the same as that shown in FIG. 4.

In the above preferred embodiment, the width of the memory bank of the SDRAM is larger than the length of the image scan line. Therefore, each scan line can be integrally disposed in the memory. However, if the memory bank of a SDRAM, for example a 1M×16 SDRAM, has a width smaller than the length of the scan line, each image scan line stored in the A-bank or B-bank must be broken into at least two lines for being disposed. As such, an image scan line is disposed in a plurality of memory lines of a memory bank. In this preferred embodiment, as shown in FIG. 37, the scan line Ln is broken into the lines Lna and Lnb for being disposed in two memory lines of the memory bank. Furthermore, in order avoid a page break problem in reading data, pixels with a length of a macroblock, that are the same as the pixels with a length of a macroblock in the next line, are repeated at the portion where the scan line is broken. A detailed description related to the page break problem can be found in the contemporaneously filed copending patent application entitled "Video decompressing system with efficiency memory access" to Wen-Kuan Chen, et al. and commonly assigned to the assignee of the present invention. Therefore, all the pixels of a frame can be disposed in the SDRAM, so as to perform a high efficient memory access as that described in the previous embodiment.

In addition, it is also applicable to apply the architecture of the present invention to the SDRAM stored with scan lines in a linear address mode. With reference to FIG. 38, the scan lines in the A-bank and B-bank are continuously disposed according to the address sequence of the SDRAM. Similarly, a high efficient memory access as described in the previous embodiment can be achieved.

Although the present invention has been explained in relation to its preferred embodiment, it is to be understood that many other possible modifications and variations can be made without departing from the spirit and scope of the invention as hereinafter claimed.

What is claimed is:

1. An architecture for video decompressor to efficiently access synchronous memory, comprising:

a synchronous memory device having an A-bank and B-bank for being stored with image data; and a memory controller for controlling data access to the synchronous memory to perform motion compensation and display, wherein the image data has a plurality of luminance scan lines and every eight scan lines are grouped for being periodically arranged in the synchronous memory in such a manner that the A-bank is sequentially stored with (8N+0)-th, (8N+1)-th, (8N+6)-th and (8N+7)-th scan lines, and the B-bank is sequentially stored with the (8N+2)-th, (8N+3)-th, (8N+4)-th and (8N+5)-th scan lines, where N is a non-negative integer, and wherein the image data has a plurality of chrominance scan lines and every eight scan lines are grouped for being periodically arranged in such a manner that the A-bank is sequentially stored with (8N+1)-th, (8N+2)-th, (8N+5)-th and (8N+6)-th scan lines, and the B-bank is sequentially stored with (8N+0)-th, (8N+3)-th, (8N+4)-th and (8N+7)-th scan lines, where N is a non-negative integer.

2. The architecture as claimed in claim 1, wherein, when reading the (8N+0)-th, (8N+1)-th, (8N+6)-th and (8N+7)-th scan lines for display, luminance data is read first and then chrominance data is read, and when reading the (8N+2)-th, (8N+3)-th, (8N+4)-th and (8N+5)-th scan lines for display, chrominance data is read first and then luminance data is read.

3. The architecture as claimed in claim 1, wherein, when reading image data from the A-bank and B-bank to perform motion compensation, the memory controller reorders the image data to be read, so as to achieve an alternate access to the A-bank and B-bank.

4. The architecture as claimed in claim 3, wherein the memory controller further adjusts the image data to be read on last three data segments, so as to achieve an alternate access to the A-bank and B-bank and terminate memory read operation on the B-bank.

5. The architecture as claimed in claim 1, wherein each scan line is integrally disposed in the synchronous memory.

6. The architecture as claimed in claim 1, wherein each scan line is broken into at least two lines for being disposed in the synchronous memory.

7. The architecture as claimed in claim 6, wherein, at a portion where the scan line is broken, pixels with a length of a macroblock, that are the same as the pixels with a length of a macroblock in the next line, are repeated.

8. The architecture as claimed in claim 1, wherein the scan lines are stored in the synchronous memory in a linear address mode.

9. An architecture for video decompressor to efficiently access synchronous memory, comprising:
   a synchronous memory device having an A-bank and B-bank for being stored with image data; and a memory controller for controlling data access to the synchronous memory to perform motion compensation and display,
   wherein the image data has a plurality of luminance scan lines and every eight scan lines are grouped for being periodically arranged in the synchronous memory in such a manner that the A-bank is sequentially stored with (8N+0)-th, (8N+2)-th, (8N+5)-th and (8N+7)-th scan lines, and the B-bank is sequentially stored with the (8N+1)-th, (8N+3)-th, (8N+4)-th and (8N+6)-th scan lines, where N is a non-negative integer, and wherein the image data has a plurality of chrominance scan lines and every eight scan lines are grouped for being periodically arranged in such a manner that the A-bank is sequentially stored with (8N+1)-th, (8N+2)-th, (8N+5)-th and (8N+6)-th scan lines, and the B-bank is sequentially stored with (8N+0)-th, (8N+3)-th, (8N+4)-th and (8N+7)-th scan lines, where N is a non-negative integer.

10. The architecture as claimed in claim 9, wherein, when reading the (8N+0)-th, (8N+2)-th, (8N+5)-th and (8N+7)-th scan lines for display, luminance data is read first and then chrominance data is read, and when reading the (8N+1)-th, (8N+3)-th, (8N+4)-th and (8N+6)-th scan lines for display, chrominance data is read first and then luminance data is read.

11. The architecture as claimed in claim 9, wherein, when reading image data from the A-bank and B-bank to perform motion compensation, the memory controller reorders the image data to be read, so as to achieve an alternate access to the A-bank and B-bank.

12. The architecture as claimed in claim 11, wherein the memory controller further adjusts the image data to be read on last three data segments, so as to achieve an alternate access to the A-bank and B-bank and terminate memory read operation on the B-bank.

13. The architecture as claimed in claim 9, wherein each scan line is integrally disposed in the synchronous memory.

14. The architecture as claimed in claim 9, wherein each scan line is broken into at least two lines for being disposed in the synchronous memory.

15. The architecture as claimed in claim 14, wherein, at a portion where the scan line is broken, pixels with a length of a macroblock, that are the same as the pixels with a length of a macroblock in the next line, are repeated.

16. The architecture as claimed in claim 9, wherein the scan lines are stored in the synchronous memory in a linear address mode.

\* \* \* \* \*